US010032511B1

(12) United States Patent
Hung et al.

(10) Patent No.: US 10,032,511 B1
(45) Date of Patent: Jul. 24, 2018

(54) MEMORY WITH DYNAMIC PERMISSIBLE BIT WRITE LOGIC AND METHOD

(71) Applicant: MACRONIX INTERNATIONAL CO., LTD., Hsinchu (TW)

(72) Inventors: Chun-Hsiung Hung, Hsinchu (TW); Chia-Jung Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/599,350

(22) Filed: May 18, 2017

(51) Int. Cl.
G11C 13/00 (2006.01)

(52) U.S. Cl.
CPC ........ G11C 13/0069 (2013.01); G11C 13/004 (2013.01); G11C 13/0026 (2013.01); G11C 13/0097 (2013.01)

(58) Field of Classification Search
CPC .................................................. G11C 11/5628
USPC ........................................................ 711/103
See application file for complete search history.

(56) References Cited

U.S. PATENT DOCUMENTS

| | | | |
|---|---|---|---|
| 7,957,204 B1* | 6/2011 | Wu ........................ | G11O 5/145 365/185.11 |
| 8,627,257 B2 | 1/2014 | Kim et al. | |
| 8,724,395 B2* | 5/2014 | Park ..................... | G11C 11/5628 365/185.22 |
| 9,026,749 B2 | 5/2015 | Yoon et al. | |
| 9,548,135 B2 | 1/2017 | Yang et al. | |
| 9,613,694 B1* | 4/2017 | Li ....................... | G11C 13/0069 |
| 2006/0039207 A1* | 2/2006 | Combe .................. | G11C 16/10 365/189.07 |
| 2009/0323453 A1 | 12/2009 | Rao et al. | |
| 2012/0002485 A1* | 1/2012 | Suwa ..................... | G11C 16/10 365/185.29 |
| 2012/0023351 A1* | 1/2012 | Wakrat .................. | G06F 1/3203 713/322 |
| 2012/0188813 A1 | 7/2012 | Chien et al. | |
| 2013/0223133 A1* | 8/2013 | Azuma .............. | G11C 13/0007 365/148 |
| 2013/0272078 A1* | 10/2013 | Nakanishi ................ | G11C 7/00 365/190 |
| 2014/0198570 A1* | 7/2014 | Hsieh ..................... | G11C 16/10 365/185.03 |
| 2016/0188213 A1* | 6/2016 | Lin .................... | G11C 16/3459 711/103 |

* cited by examiner

Primary Examiner — Min Huang
(74) Attorney, Agent, or Firm — Haynes Beffel & Wolfeld LLP

(57) ABSTRACT

For a memory array including a plurality of bit lines, and a set of write drivers having a number N members configured for connection in parallel to a selected set of N bit lines in the plurality of bit lines, write logic is coupled to the set of write drivers which enables a permissible number less than said number N of said members of the set of write drivers to apply a write pulse in parallel in a write operation. The write logic can dynamically assign permissible numbers to iterations in an iterative write sequence. A power source, such as charge pump circuitry, coupled to the set of write drivers can be utilized more efficiently in systems applying permissible bit write logic, enabling higher throughput or utilizing lower peak power.

15 Claims, 6 Drawing Sheets ion to a selected set of N bit lines in the plurality of bit lines. Write logic is coupled to the set of write drivers which enables a maximum permissible number less than said

MEMORY WITH DYNAMIC PERMISSIBLE BIT WRITE LOGIC AND METHOD

BACKGROUND

Field

The present invention relates to write logic and write operations for memory devices, including devices using parallel write operations like page programming.

Description of Related Art

Programmable resistance memory utilizes a memory material, such as a metal oxide material or a phase change material, which changes resistance between two or more stable resistance ranges by application of electrical pulses. The two or more resistance ranges correspond to data states. Access lines such as bit lines and word lines coupled to the memory cells are connected to circuitry to perform writing operations, such as SET and RESET operations, which switch the programmable element between lower and higher resistance ranges.

Integrated circuit memories of this type are often configured to write a number of memory cells in parallel. For instance, some integrated circuit memories are configured to write 32 memory cells or 64 memory cells in parallel. In other integrated circuits, page writing is implemented, in which larger numbers, such as 1028 or more memory cells can be written in parallel.

The amount of power required to execute a write operation (which can be a set operation or a reset operation for some types of memory technologies, and can be a program operation or an erase operation for other types of memory cells) depends on the number of memory cells being written, and on the data pattern to be stored in the memory cells. Also, it depends on variations in manufacturing among the cells, temperature and other factors. For some memory technologies, the writing operation can involve the application of write pulses of relatively high magnitude which can require significant amounts of current for each memory cell receiving the pulse. Because of the high magnitude voltages, integrated circuits often include charge pump circuitry to produce the write pulses. Charge pumps can require relatively large amounts of area on an integrated circuit in order to produce the voltage pulses with sufficient current driving capability for writing large numbers of memory cells in parallel.

As memory technologies evolve to larger and larger capacity, with larger and larger parallel writing operations, the implementation of suitable charge pumps can present difficult design trade-offs. Write throughput can be dominated by the capability of the charge pump circuitry on an integrated circuit in some implementations. This involves a trade-off between the costs and area consumed by charge pump circuitry on the device, and write throughput.

It is desirable therefore to provide technologies that can reduce the costs of implementation of high density memory.

SUMMARY

A memory device is described comprising a memory array including a plurality of bit lines, and a set of write drivers having a number N members configured for connection to a selected set of N bit lines in the plurality of bit lines. Write logic is coupled to the set of write drivers which enables a maximum permissible number less than said number N of said members of the set of write drivers to apply a write pulse in a write operation. In some embodiments, write logic can dynamically assign different permissible numbers to different pulses in a write sequence. A power source, such as charge pump circuitry, coupled to the set of write drivers can be utilized more efficiently in systems applying permissible bit write logic, enabling higher throughput or utilizing lower peak power.

In an embodiment described herein, the write logic is configured for a write operation in which a subset of the set of N bit lines is flagged to receive a pulse in parallel, where the subset is a function of the data pattern to be written. The subset includes a number of members greater than a permissible number in some instances of the operation. The write logic in such case, using mask logic or other types of logical circuitry, enables a first group of write drivers in the set of write drivers to apply pulses in parallel while disabling other write drivers in the set of write drivers, and then enables a second group of write drivers in the set of write drivers to apply pulses in parallel while disabling other write drivers in the set of write drivers, where the groups can be defined by the write logic circuits either with or without reference to the data pattern. The first and second groups have respective numbers of members equal to or less than the permissible number. The write logic can enable application of write pulses in a sequence including a plurality of such groups, until all members of the subset of the set of N bit lines receives a write pulse for a particular cycle.

In embodiments described herein, the write operation includes an iterative write sequence including a plurality of pulse and verify iterations in which the pulses are applied by the set of write drivers, where a pulse and verify iteration constitutes a write cycle using the set of write drivers. In some embodiments, the iterative write sequence can comprise an incremental step pulse programming ISPP operation, or other type of operation in which pulses applied to bit lines in at least one of the iterations have a pulse magnitude different than pulses in other iterations in the plurality of iterations. In iterative write sequences, the control logic can assign different permissible numbers to different iterations in the plurality of iterations. In some embodiments, the permissible number assigned to at least one iteration is different than the permissible number assigned to another iteration in the plurality of iterations.

The device can include a buffer configured to store a data pattern to be written using the set of write drivers. An iterative write sequence can include a pre-verify step to set flags for write drivers in the set of write drivers connected to bit lines for memory cells that fail the pre-verify step. The flags identify members of the subset to which a write pulse is to be applied in a following iteration. The write logic can be configured to count set flags after the pre-verify step to identify a starting subset of the set of N bit lines, and to count set flags after each verify step in succeeding iterations of the iterative write sequence to identify a current subset of the set of N bit lines.

Methods for operating a memory device are described, including a method comprising connecting set of write drivers having a number N members in parallel to a selected set of N bit lines in the plurality of bit lines; identifying a number of the write drivers for applying a write pulse according to a data pattern being written and a status of the write operation, and enabling a permissible number less than said number N of said members of the set of write drivers, and in some cases less than the identified number of write drivers for the current iteration, to apply a write pulse in parallel in a write operation.

A method described herein comprises applying a write sequence to write a data pattern in a set of memory cells, the sequence including a plurality of pulse and verify iterations. Pulses in the sequence applied to memory cells in at least one of the iterations have a pulse magnitude different than pulses in other iterations in the plurality of iterations. The method includes determining a subset of the set of memory cells to which the pulse is to be applied for each iteration, and for an iteration in which the subset has a number of members larger than a permissible number, applying pulses in parallel to memory cells in a first group of memory cells in the subset, and then applying pulses in parallel to memory cells in a second group of memory cells in the subset. The first and second groups of memory cells have respective numbers of members less than or equal to the permissible number for the current iteration.

In a method for operating described herein, a step of assigning a permissible number of memory cells for each iteration in the plurality of iterations is included. In this case, the permissible number assigned to at least one iteration is different than the permissible number assigned to another iteration in the plurality.

In an embodiment of a method described herein, the write sequence can include a pre-verify step. The method can include setting flags for memory cells that fail the pre-verify step to identify members of the subset which are to receive a write pulse in parallel is a first pulse and verify iteration of the plurality of iterations. The method can include counting the number of memory cells having set flags in the subset after the pre-verify step for comparison with the permissible number assigned to the current iteration.

Other aspects and advantages of the present invention can be seen on review of the drawings, the detailed description and the claims, which follow.

DETAILED DESCRIPTION

A detailed description of embodiments of the present invention is provided with reference to the FIGS. 1-7.

Figure 1:
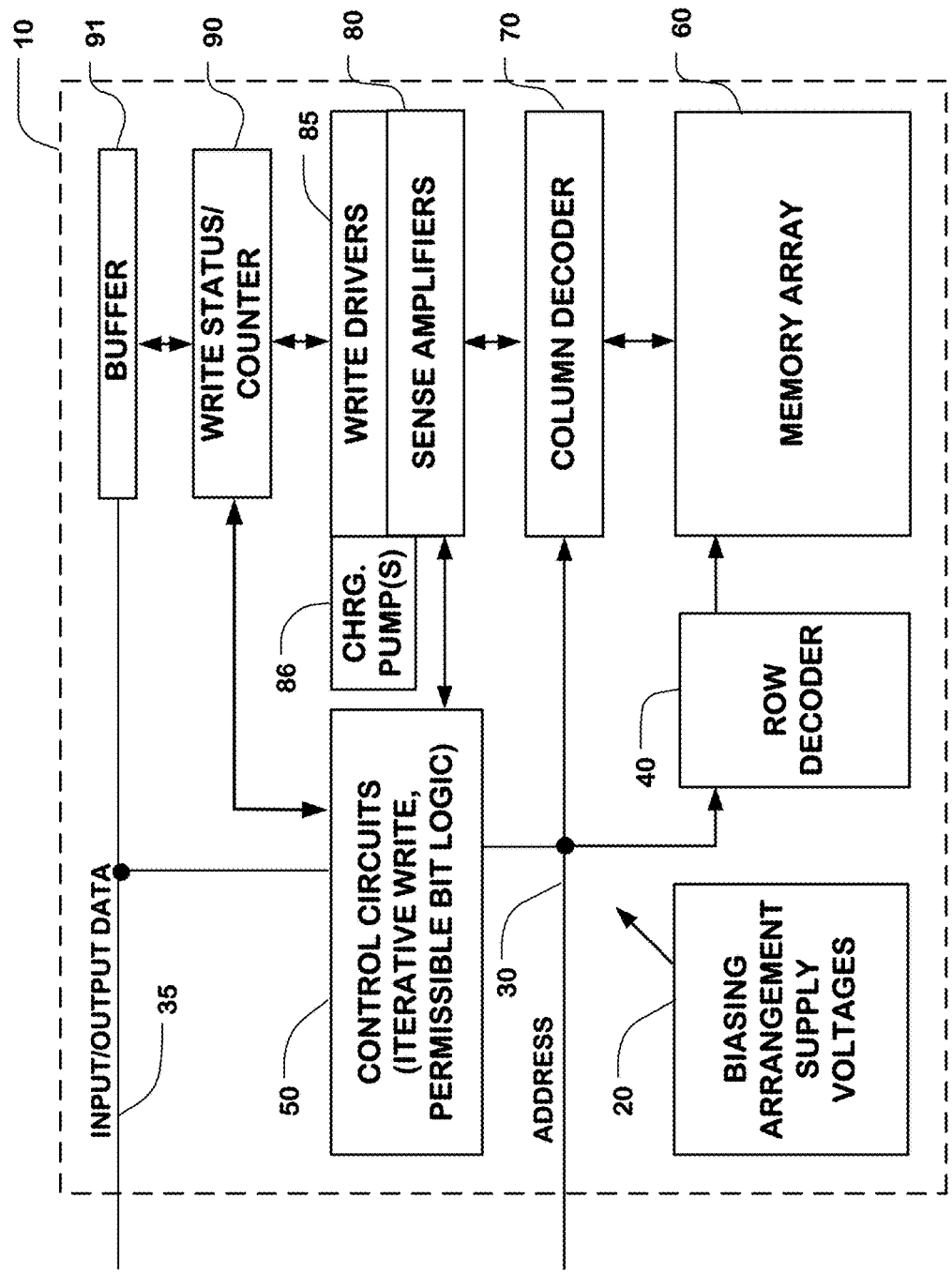
FIG. 1 is a simplified block diagram of a memory device implemented on an integrated circuit including permissible bit write logic as described herein.

FIG. 1 is a simplified diagram of a memory device 10 implemented on an integrated circuit configured for writing operations, including logic for permissible bit write procedures as described herein. The memory device can be implemented on a single integrated circuit chip, on a multichip module, or on a plurality of chips configured as suits a particular need.

The memory device 10 in this example includes a memory array 60 on an integrated circuit substrate. The memory array 60 can be a programmable resistance memory implemented using metal oxide memory cells, phase change memory cells, magneto-resistive memory cells, and other types of memory cells. The memory array 60 can be a NAND flash memory based on charge trapping memory cells. The memory array 60 can include multiple-level cells MLC that store two or more bits of data per cell. The memory array 60 can be implemented using two-dimensional or three-dimensional array technology.

A programmable resistance memory cell can have a resistance programmed in any of two or more resistance ranges, each corresponding to a data state. For simplicity, the present application will describe a programmable element having two resistance ranges, but it will be understood that there may be more.

The block diagram in FIG. 1 includes a row decoder 40 coupled to a plurality of word lines arranged along rows in the memory array 60. A column decoder 70 is coupled to a plurality of bit lines arranged along columns in the memory array 60 for reading data from and writing data to the memory array 60. Addresses are supplied on address lines 30 to control circuits 50 implementing a command decoder and control logic modules, to column decoder 70 and to row decoder 40, in this simplified illustration. Data are supplied on data lines 35 to buffer 91 and to the control circuits 50. In other examples, an input/output port may be used in which addresses and data may be provided on shared lines. Also, serial interfaces may be deployed. There may be address counters and other logic included for providing addresses and decoding addresses.

Sense amplifier circuits 80 are coupled to the column decoder 70, in this example. Also, write driver circuits 85 are coupled to the column decoder 70. The sense amplifier circuits 80 and write driver circuits 85 can be configured for parallel page writing. Write logic coupled to the sense amplifier circuits 80 and the write driver circuits 85 can include latches or other memory elements used to store write/inhibit status or in the writing operations. The write driver circuits 85 are connected to charge pump circuits 86 which can include one or more charge pumps, used for providing power for write pulses to the write driver circuits 85. The write driver circuits 85 include a set of write drivers including a number N of members coupled to a corresponding number N of data lines, which are in turn coupled to selected bit lines in the memory via the column decoder 70 for a given write operation. Thereby, the N write drivers are configured for connection in parallel to a selected set of N bit lines in the plurality of bit lines. Word lines are used in combination with the selected bit lines to select memory cells for a given write operation. The device can be operated by connecting a set of write drivers having a number N members in parallel to a selected set of N bit lines in the plurality of bit lines; and enabling a permissible number less than said number N of said members to apply a write pulse in parallel in a write operation.

In the illustrated embodiment, the write logic includes status and counter circuits 90 coupled to the write driver circuits 85. The write status and counter circuits 90 are configured to set write/inhibit flags, which can be stored in latches coupled to the write driver circuits 85, and associated with each write driver and its corresponding data line. The write/inhibit flag for a given data line is a function of a data pattern being written, and of verify logic applied in the write operations that can determine resistance levels of selected cells. The verify logic determines whether an addressed memory cell coupled to the corresponding data line stores the target data value by having a resistance in a target range for the data pattern being written.

Examples of status counting circuits are described in U.S. Pat. No. 9,548,135, entitled METHOD AND APPARATUS FOR DETERMINING STATUS ELEMENT TOTAL WITH SEQUENTIALLY COUPLED COUNTING STATUS CIRCUITS, by Yang et al., which is incorporated by reference as if fully set forth herein. The counting circuits are configured to count a number of write/inhibit flags set for a set of write drivers.

The write driver circuits 85 can include circuits for selectively applying write pulse voltages and inhibit voltages to data lines, and through the column decoder to bit lines in the memory, in response to the write/inhibit flags.

Sensed data from the sense amplifier circuits 80 are supplied to buffer 91, for supply to input/output drivers on the integrated circuit in read operations. Also, input data is applied in this example to the buffer 91, which can store a data pattern to be written using the write operations as described herein.

In the example shown in FIG. 1, control circuits 50 include control modules implementing a control logic state machine, or state machines, which controls, or control, the application of supply voltages supported, generated or provided through the voltage supply or supplies in block 20 and the charge pump circuits 86, such as read, verify and write voltages for iterative write operations like variations of ISPP operations. Also, these control circuits 50 can be used for controlling and executing read operations.

The control circuits 50 are coupled to the write status and counter (or adder) circuits 90 and the memory array 60 and other elements of the integrated circuit as needed. The control modules in the circuits 50 include logic to control permissible bit write operations described in more detail below.

The control circuits can be configured to apply a write sequence to write a data pattern in a set of memory cells, the write sequence including a plurality of pulse and verify iterations, in which pulses applied to memory cells in at least one of the iterations can have a pulse magnitude different than pulses in other iterations in the plurality of iterations; to determine a subset of the set of memory cells to which the pulse is to be applied for each iteration; and for an iteration in the plurality of iterations in which the subset has a number of members larger than a permissible number, to apply pulses in parallel to memory cells in a first group of memory cells in the subset, and then applying pulses in parallel to memory cells in a second group of memory cells in the subset, where the first and second groups have respective numbers of members equal to or less than the permissible number.

The control circuits can be configured to assign a permissible number of memory cells for each iteration in the plurality of iterations, in which the permissible number assigned to at least one iteration is different than the permissible number assigned to another iteration in the plurality. In an iteration in which the pulse magnitude is higher than in another iteration, the permissible number can be lower so that the power applied during the iteration higher pulse magnitude can be maintained within a range supported by charge pump circuits, or other sources of the voltage pulses for the set of write drivers.

The control circuits 50 including state machines, and other parts of the device 10, can include modules implemented using special-purpose logic circuitry as known in the art. In alternative embodiments, the control circuits 50 can include modules implemented using a general-purpose processor, which can be implemented on the same integrated circuit, which executes a computer program to control the operations of the memory device 10. In yet other embodiments, a combination of special-purpose logic circuitry and a general-purpose processor can be utilized for implementation of modules in the control circuits 50.

The memory array 60 can comprise metal oxide memory cells. The description herein is based on the use of metal oxide memory cells. The technology can be used with other memory cell technologies. In other examples, the memory cells may comprise other types of programmable resistance memory cells, and with charge storage based flash memory. Examples of programmable elements used in programmable resistance memory cells include metal oxides such as tungsten oxide (WOx), hafnium oxide (HfOx), titanium oxide (TiOx), tantalum oxide (TaOx), titanium nitride oxide (TiNO), nickel oxide (NiOx), ytterbium oxide (YbOx), aluminum oxide (AlOx), niobium oxide (NbOx), zinc oxide (ZnOx), copper oxide (CuOx), vanadium oxide (VOx), molybdenum oxide (MoOx), ruthenium oxide (RuOx), copper silicon oxide (CuSiOx), silver zirconium oxide (AgZrO), aluminum nickel oxide (AlNiO), aluminum titanium oxide (AlTiO), gadolinium oxide (GdOx), gallium oxide (GaOx), zirconium oxide (ZrOx), chromium doped SrZrO3, chromium doped SrTiO3, PCMO, or LaCaMnO, etc. In some cases, the programmable element of a memory cell can be a semiconductor oxide, such as silicon oxide (SiOx). In some cases, the programmable element can be a phase change material, or a magneto-resistive material.

Figure 2:
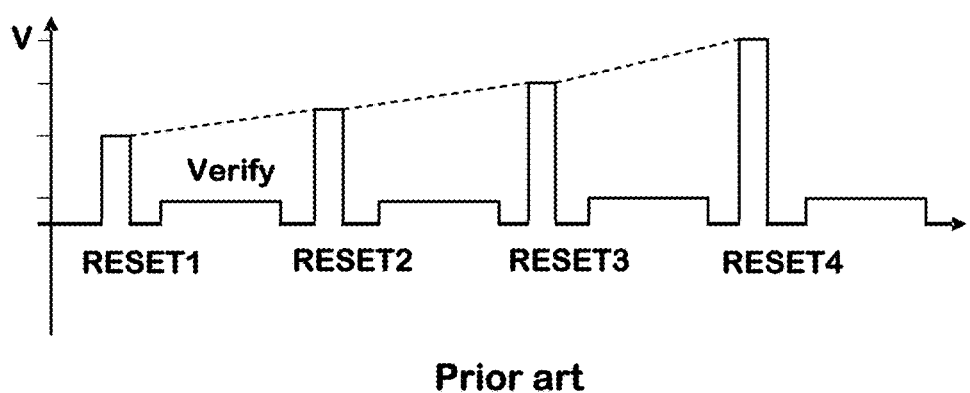
FIG. 2 illustrates a prior art iterative write procedure used to write data to a memory cell.

A known way to write such programmable resistance memory cells and flash memory cells is by iterative write operations, including incremental step pulse programming (ISPP), a simplified example of which is described with reference to FIG. 2. In this example, to perform a RESET operation (cause change to higher resistance range), for example, a sequence of iterations is performed, including a first iteration including a write pulse (RESET1) followed by a verify step to determine if the resistance of the programmable element is in the target resistance range. If it is not, a second iteration is performed including a write pulse (RESET2) with an increased amplitude, followed by another verify step, and so on. Four steps are shown in FIG. 2, but a given implementation may be configured to continue iterating until all the memory cells are reset as needed for the data pattern being written or until a maximum number of retries is executed. In each iteration, variations in the pulse shape can be used, including the pulse width and the amplitude. These pulse and verify iterations, which may be called a write and write verify cycle, continue until a verify step confirms that the resistance of the programmable element is within the target resistance range. Iterative operations can also be applied for SET operations (cause change to lower resistance range). As illustrated in FIG. 2, the power of the write pulse required for each iteration changes as a magnitude or other parameter of the pulse shape changes.

For page mode write operations, or other operations that apply a write pulse in parallel to a plurality of memory cells, the power required of the charge pump is a function of the number of write drivers used at the same time to apply write pulses to the corresponding data lines. Therefore, charge pump circuitry 86 supporting write drivers is designed to provide sufficient power for all the write drivers operating in parallel in a given iteration, at a given write pulse magnitude. As the pulse magnitude increases, this can require designing the circuit for relatively high power.

The number of drivers applying a write pulse is a function of the data pattern, and of the results of verify steps in the iterative write operation. This number is reflected in the status of the write/inhibit flags coupled with the write driver circuits 85 in the example discussed above with respect to FIG. 1. This logic identifies a number of the write drivers for applying a write pulse in a given iteration, according to a data pattern being written and a status of the write operation. Other logical configurations can be used to determine the number of drivers needing to apply a write pulse for a given iteration.

The control circuits 50, and supporting circuitry on the integrated circuit, are configured in embodiments described herein to limit the maximum power required of the charge pump circuitry, or other source of voltage pulses, for any given iteration in a write operation for a plurality of memory cells in parallel.

Figure 3:
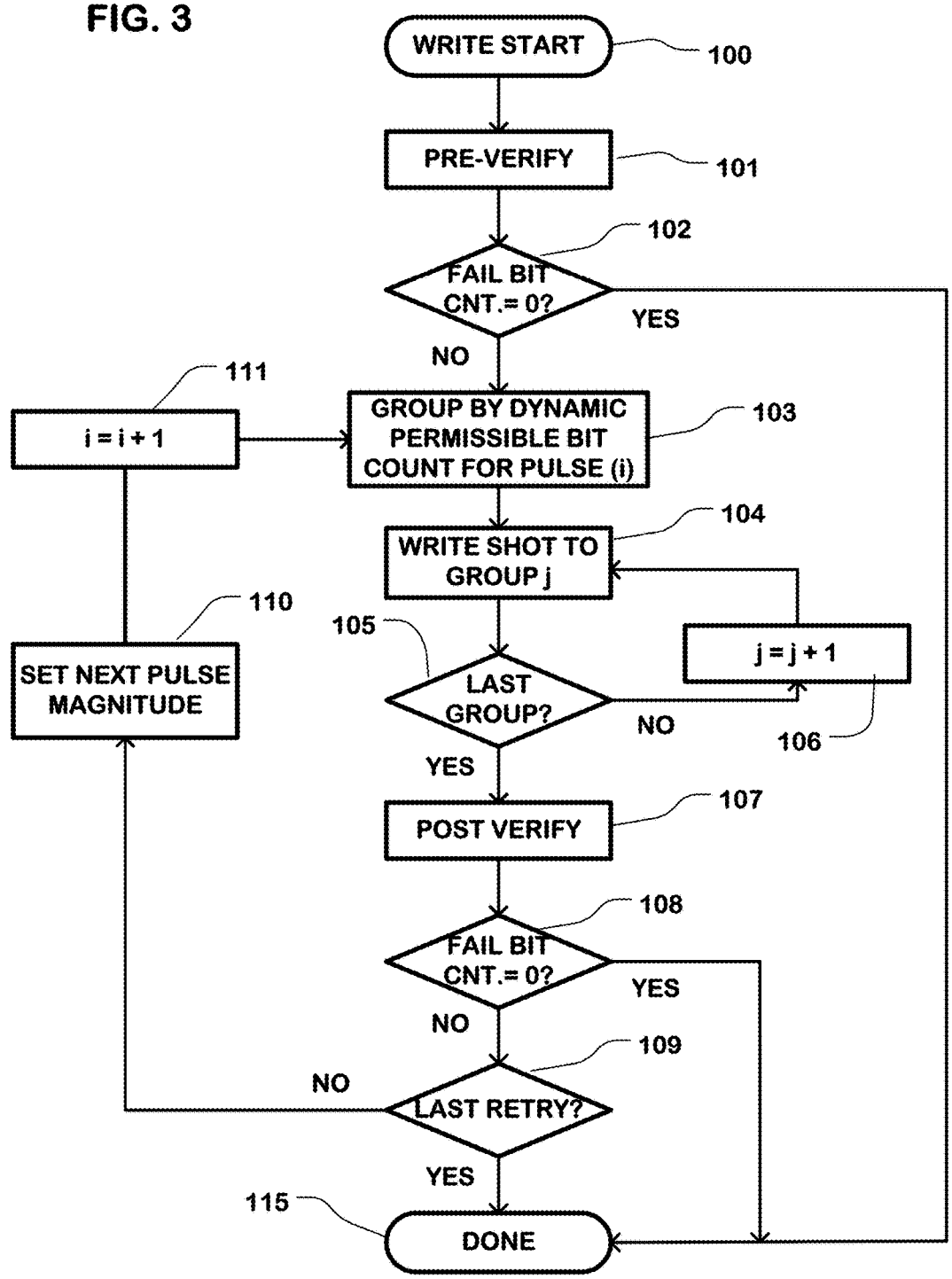
FIG. 3 is a flow chart for an embodiment of a permissible bit, iterative write procedure as described herein.

In one embodiment, the control circuits 50 and supporting circuits on the device are configured to execute a procedure such as that shown in FIG. 3. According to this procedure, a write operation starts at block 100. Write operation can start by loading a data pattern, such as a page of data, into a buffer 91 to be written in parallel to an addressed set of memory cells. Next, a pre-verify step is executed (101). In the pre-verify step, the data value in the data pattern stored in the buffer 91 is compared to the data value represented by the resistance of the selected memory cells as indicated by sense amplifier output when a verify voltage is applied to the corresponding word line. If the data value of a selected memory cell in the set being written matches the corresponding data value in the buffer 91, then the write/inhibit flag for the corresponding data line and write buffer is reset to the inhibit state. Also, if the write operation is being executed to perform a RESET for the purposes of storing the data pattern, then the write/inhibit flags for memory cells that are not to be RESET according to the data pattern are also reset to the inhibit state. If the data value in a selected memory cell does not match the corresponding data value in the buffer 91 (fails pre-verify), then the write/inhibit flag for the corresponding data line and write buffer is set to the write state.

After setting up the write/inhibit flags according to the data pattern using the pre-verify step 101, the procedure counts the number of write/inhibit flags in the write state as a result of failing the pre-verify step, indicated in the Figure as a "fail bit count." At step 102, it is determined whether the fail bit count is equal to zero, indicating that all of the memory cells have been successfully written. If the fail bit count is zero at step 102, the procedure is done, branching to block 115.

If at step 102 the fail bit count is nonzero, then the control circuits group the write drivers, by assigning write drivers having a write/inhibit flag set to the write state to one or more groups in block 103, where the number of members in each group is less than or equal to a permissible count for the current iteration (pulse (i)).

In this manner, a charge pump must be configured to deliver the power required in the current iteration in order to deliver the write pulse having the pulse magnitude of the current iteration, times the permissible count for the current iteration.

The control circuits can include a logical mask configurable to mask the write/inhibit flag for selected write drivers, enabling the application of a write pulse to a sequence of groups of memory cells each of which has a number of members equal to or less than the permissible count. The logical mask can have predetermined mask patterns, which can be readily applied, and then the number of unmasked flags in the write state counted again, and if the number remains over the permissible bit count, then apply a different preset mask in a sequence until a successful mask pattern is found. In other embodiments, the mask pattern can be computed in each iteration, masking set flags until the permissible bit count is not exceeded. Alternatively, the control circuits can include logic to change the values of the write/inhibit flags for the purposes of a grouping logic to override the flags coupled with write drivers outside the current group. In this alternative, the status of the overridden flags can be saved and restored for applying the write pulses in subsequent groups, or the procedure can return to the pre-verify step.

The permissible count as described herein is less than the number of memory cells required to store the data pattern subject of the write operation in all iterations of the iterative write operations, in some embodiments. In other embodiments, the permissible bit count in one or more of the iterations, such as iterations with a higher magnitude write pulse, is less than the number of memory cells required to store the data pattern subject of the write operation in all iterations of the iterative write operations.

In embodiments described herein, the permissible count is changed according to the requirements of the various iterations in the iterative write process.

After performing the grouping step of block 103, a write pulse is applied at block 104 to the current group (group j). The logic then determines whether the last group has received the write pulse (105). If not, then the procedure increments the group index j (block 106) and loops back to block 104 to apply the write pulse to the next group. If at block 105, it is determined that all of the groups have received the write pulse for the current write pulse iteration, then a post verify step is executed (block 107). In the post verify step, the write/inhibit flags are updated so that only memory cells requiring an additional write pulse have flags in the write state.

Logic in this procedure then determines whether the fail bit count is equal to zero at block 108. If the fail bit count is now zero, then the algorithm is done, and branches to block 115. If at block 108, the fail bit count is nonzero, then the algorithm determines whether the last retry iteration has been executed (block 109). If the last retry has been executed, then the algorithm is done and the operation has failed. If the last retry operation has not been completed at block 109, then the algorithm sets a pulse magnitude for a next iteration in the iterative write process (block 110), and increments the pulse index i (block 111). Then, the algorithm loops back to block 103 to apply the permissible bit grouping logic using the permissible bit number for the current iteration, and to execute the next iteration. This process continues until a maximum number of retries is executed, or until the data pattern is successfully written.

FIG. 3 is a flowchart illustrating logic executed by control logic on a memory device. The logic can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel or performed in a different sequence without affecting the functions achieved. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

Figure 4:
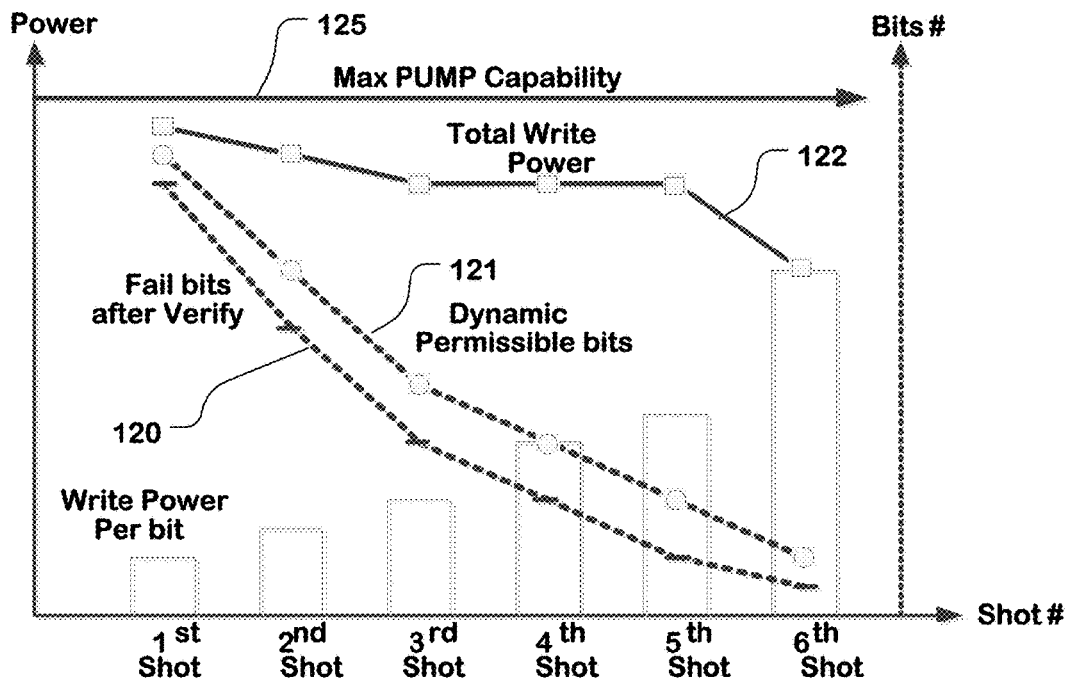
FIG. 4 is a chart illustrating write power for iterative write procedures, including a permissible bit procedure as described herein.

FIG. 4 is a chart showing charge pump power on the left vertical axis and the number of bits receiving write pulses in parallel on the right vertical axis, while showing the write power per pulse for a sequence of iterations labeled first shot through sixth shot on the horizontal axis. As discussed with respect to FIG. 2, in some iterative write operations, the pulse magnitude increases with each iteration.

In FIG. 4, increasing pulse magnitude is illustrated. FIG. 4 includes a trace 120 which indicates the typical performance of the number of failed bits indicated in the write/inhibit flags after a verify operation. As can be seen, the number of failed bits decreases as the procedure performs successive iterations. So, although the power per bit being written increases, the number of bits receiving write pulses, and the corresponding number of enabled write drivers, decreases, or should decrease, as the procedure progresses.

Trace 121 in FIG. 4 illustrates use of a changing number of permissible bits, based on which iteration of the iterative procedures is being executed. The number of permissible bits during the first shot can be the highest number, and can be less than the number of write drivers configured for operation in parallel for the write procedure. For each succeeding shot, the number of failed bits should decrease while the power per memory cell increases. The number of permissible bits falls as the power per memory cell increases, but as the number of failed bits decreases the likelihood in a write pulse iteration that all of the write state bits (fail after verify) as shown on trace 120 receive a write pulse in a first group is relatively high. As the power of the write pulses increases, the number of permissible bits can decrease to as low as one bit for higher power pulses. Total write power illustrated on trace 122 is a function of the number of failed bits receiving a write pulse capped by the number of permissible bits in the current iteration, and the magnitude of the pulse. Thus, the total write power can be controlled so that it does not increase as iteration proceeds, or so that it otherwise remains within the maximum capability 125 of the source of power for the write pulses.

Figure 5:
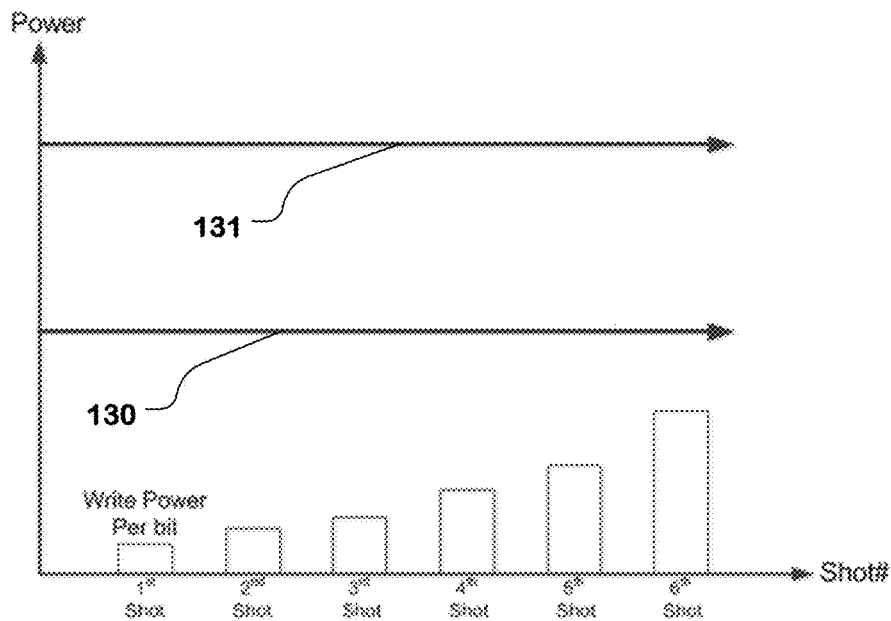
FIG. 5 is a chart illustrating charge pump power requirements for iterative write procedures, including a permissible bit procedure as described herein.

FIG. 5 is a chart showing charge pump power on the left vertical axis, and write power per bit for each iteration on the horizontal axis, represented by the first shot through the sixth shot. Using a changing number of permissible bits, as discussed with reference to FIG. 4, the maximum pump power required can be set at a level shown by trace 130. Without using permissible bit logic, a charge pump would be required to be designed to provide a power level shown by trace 131, which is substantially higher.

Throughput can be improved, using a dynamic permissible bit scheme, because the number of permissible bits allowed in the first iteration can be higher than for subsequent higher pulse power iterations compared to an implementation in which the number of permissible bits is a constant and lower than the number of write drivers. A higher number of permissible bits during early iterations allows for more iterations to be successfully executed using a single group, reducing the number of iterations requiring the pulses to be applied in more than one group. Also, charge pump size can be reduced in some implementations of dynamic permissible grouping.

Figure 6:
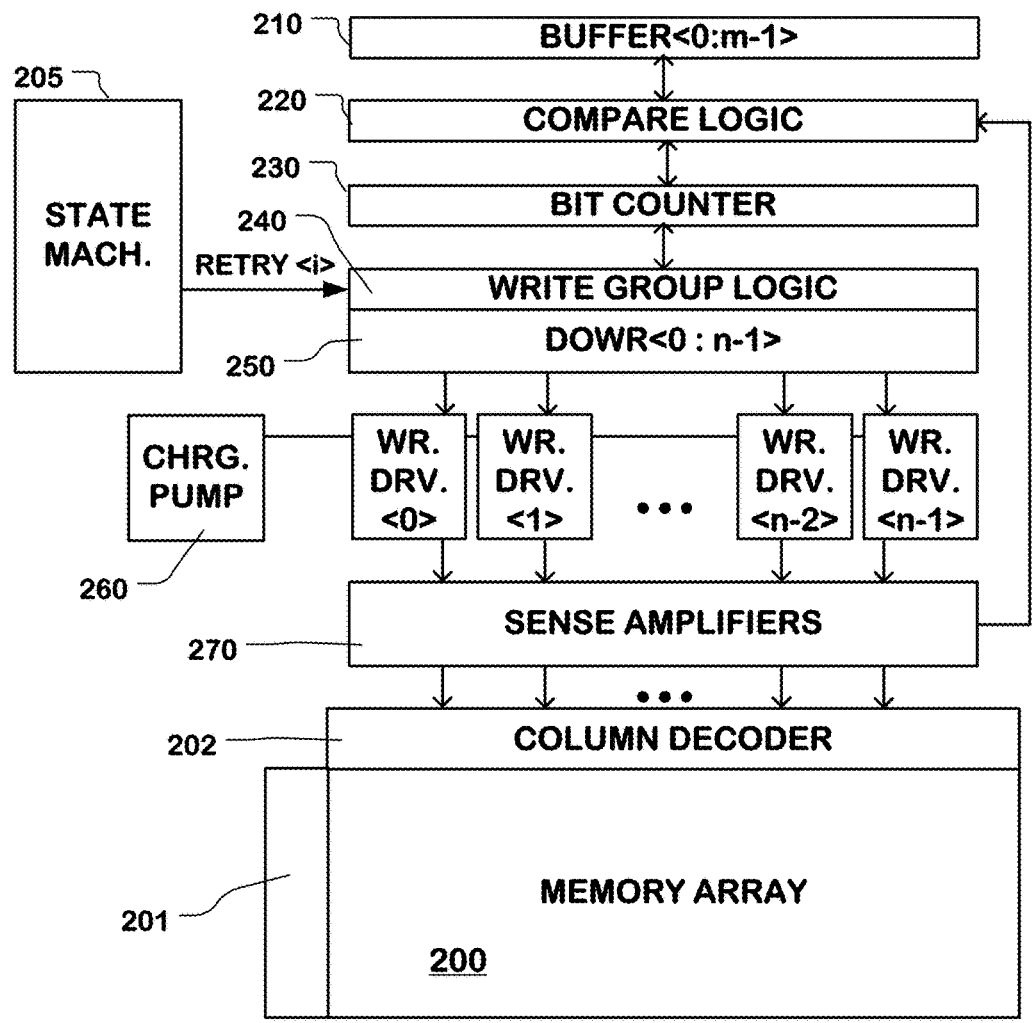
FIG. 6 is a simplified block diagram of a memory device including iterative write logic, and parallel write drivers for permissible bit procedures as described herein.

FIG. 6 is a block diagram illustrating a configuration of write logic implementing permissible bit count grouping as described herein. In FIG. 6, the diagram shows a memory array 200 coupled with a row decoder 201 and a column decoder 202. A state machine 205 is coupled to logic blocks in the circuit. An input buffer 210 is configured to store a data pattern including a data pattern having M bits<0:m−1>. Sense amplifiers 270 coupled to the column decoder 202 are able to sense data values in a verify step for selected memory cells, and provide the sensed data to compare logic 220. Also, the buffer 210 is coupled to the compare logic 220. The compare logic 220 can include latches storing the write/inhibit flags, or verify fail bit flags, as discussed above. The compare logic 220 is coupled to a bit counter 230, which counts the number of write/inhibit flags having the write state, indicating the number of memory cells to receive a write pulse during a given iteration of a write procedure. The bit counter 230 is in turn coupled to write grouping logic 240. The state machine 205 provides a retry index <i> to the write grouping logic 240. The write grouping logic is coupled to a "do write DOWR" mask 250. The mask DOWR<0:n−1> has one bit per write driver in this example set as discussed above according to the number of permissible bits which can be written in a current retry <i>. A charge pump 260 provides pulse power to a set of write drivers including a number N members, including write driver <0> to write driver <n−1>. The number N can be as large as the maximum number M that can be stored in the buffer 210, or some other number. For a given retry in the write procedure, the number of write drivers delivering pulses via the column decoder 202 to bit lines in the array is limited by the permissible number of bits for the current iteration.

Figure 7:
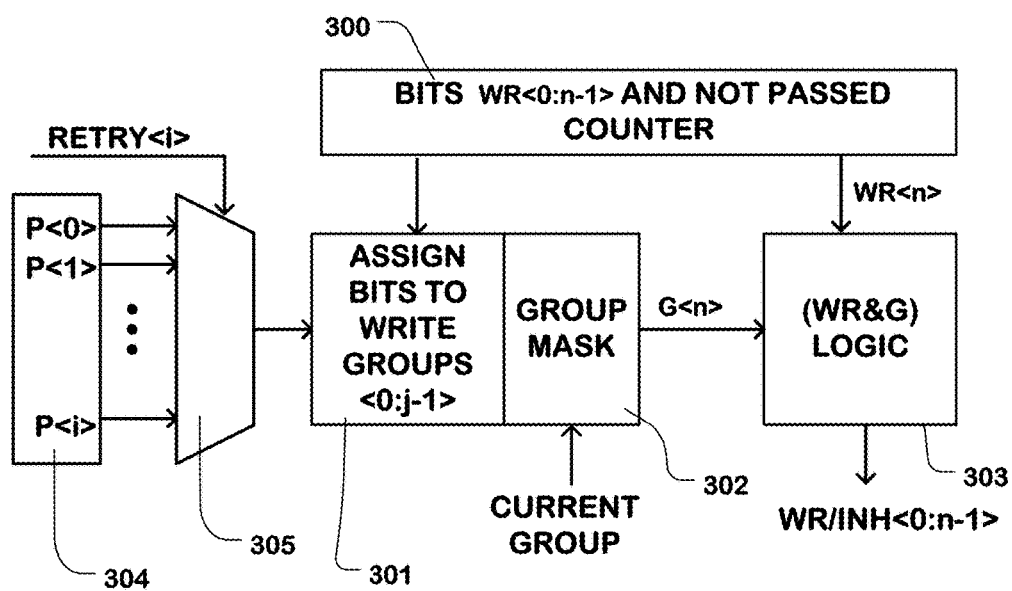
FIG. 7 is a simplified diagram of write grouping logic usable in embodiments of permissible bit procedures as described herein.

FIG. 7 is a logical diagram for write grouping logic (e.g. 240 of FIG. 6) with permissible bit circuitry usable with the embodiments of FIG. 2 and FIG. 6. In the logical diagram of FIG. 7, circuitry 300 includes a register or plurality of latches for storing write/inhibit flag bits WR<1:n>, where the flag indicates a "not passed" state if the corresponding one of N write drivers is to apply a write pulse, and indicates an inhibit state if the corresponding cell has passed verify or is not to be written. Also the circuitry 300 includes counter circuitry (NOT PASSED COUNTER) which provides a number of flag bits indicating a not passed state for the write operation. The circuitry 300 provides write/inhibit flag bits WR<0:n−1> for the N write drivers and the count of not passed state flag bits to logic 301. Write/inhibit flag bits WR<0:n−1> flags are set to the not passed state for the memory cells that fail the pre-verify step or the verify step in a preceding iteration to identify members of the subset of the set of memory cells to which the pulse is to be applied in a next pulse and verify iteration of the plurality of iterations.

In logic 301, the flag bits WR<0:n−1> are assigned to J write groups <0:j−1>, where j can be 1 or more, and a group mask G<0:n−1> is set up in logic 302 for the current group. In this example, the group mask G<0:n−1> is a function of the number of not passed flag bits and the permissible number. For example, if the set of write drivers includes 128 members, and the data pattern of not passed flag bits includes 96 members and the maximum permissible number for the current iteration is 64 members, the group mask is set to enable a selected group including 64 of the 96 drivers having not passed flags. If 64 of the 96 drivers are disposed in the first 90 drivers, then the mask can enable the first 90 drivers for the first pulse and verify step for the first group of the current iteration as a function of the permissible number and the data pattern, and then enable the last 38 drivers for the second group. Alternatively, the first group can have a number of that is equal to the permissible number for the current iteration, which can be independent of the data pattern. Other logical combinations can be used as well to produce the group mask G<0:n−1>.

The group mask G<0:n−1> is applied to the output WR<0:n−1> of the circuitry 300 in logic 303 to provide a group of write/inhibit flags WR/INH<0:n−1> to corresponding write drivers. The number of permissible bits is assigned by the logic in this example by storing a table 304 having a number assigned to each iteration, or to groups of iterations, for a write procedure. The current iteration is indicated by the RETRY<i> value provided from the control logic to a selector 305. The output of the selector 305 is used for the purposes of assigning the bits WRG<0:n−1> output from circuitry 300 to corresponding groups as discussed above. FIG. 7 shows logic supporting a method for operating a memory including for a given write cycle, enabling a first group of write drivers in the set of write drivers to apply pulses in parallel while disabling other write drivers in the set of write drivers, and then enabling a second group of write drivers in the set of write drivers to apply pulses in parallel while disabling other write drivers in the set of write drivers, where the first and second groups have respective numbers of members equal to or less than the permissible number. Also, different permissible numbers can be assigned to different iterations in an iterative write sequence.

A memory is described that includes a buffer system comprising a bit counter or adder, and control logic to control write operations with dynamic permissible bits per shot. The memory is described including control circuitry configured to execute a parallel write scheme including iterative write cycles, in which different numbers of permissible bits are allowed for different shots. Logic is described to determine the number of permissible bits to be provided for each iteration in a write sequence.

According to the technology described herein, the trade-off involved in designing charge pump circuitry for high density memory is eased, allowing more efficient use of area on an integrated circuit, thereby improving costs. Also, the technology can be deployed to improve throughput of write operations for high density memory.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
 a memory array including a plurality of bit lines;
 a set of write drivers having a number N of members configured for connection in parallel to a selected set of N bit lines in the plurality of bit lines;
 a buffer configured to store a data pattern to be written using the set of write drivers; and
 write logic coupled to the set of write drivers and to the buffer, configured to execute an iterative write sequence including pulses applied by a subset including a second number of members in the set of write drivers selected according to the data pattern, and which assigns different permissible numbers to different pulses in the write sequence; and which enables less than said number N of said members for particular pulses in the write sequence when the second number of members in the subset for the particular pulse exceeds the permissible number assigned for the particular pulse.

2. The memory device of claim 1, wherein the write logic is configured for a write sequence including a plurality of pulse and verify iterations, and in which for an iteration in the plurality of iterations, the subset of the set of N bit lines is flagged to receive pulses in parallel, the second number of members being greater than the assigned permissible number, to enable a first group of write drivers in the set of write drivers to apply pulses in parallel while disabling other write drivers in the set of write drivers, and then to enable a second group of write drivers in the set of write drivers to apply pulses in parallel while disabling other write drivers in the set of write drivers.

3. The memory device of claim 2 in which the pulses applied to bit lines in one iteration have pulse magnitudes different than other iterations in the write sequence.

4. The memory device of claim 2,
 wherein the iterative write sequence includes a pre-verify step to set flags for the write drivers in the set of write drivers connected to bit lines for memory cells that fail the pre-verify step to identify members of a subset; and including
 the write logic includes circuits to count set flags after the pre-verify step.

5. The memory device of claim 2, wherein write logic sets flags in the pulse and verify iterations for write drivers connected to bit lines of memory cells that fail verify.

6. The memory device of claim 1, including charge pump circuitry connected to the set of write drivers to provide power for applying write pulses in parallel to bit lines in the set of N bit lines.

7. A method for operating a memory array including a plurality of bit lines, the method including:
 connecting a set of write drivers having a number N of members to a selected set of N bit lines in the plurality of bit lines;
 storing a data pattern to be written using the set of write drivers in a buffer;
 executing an iterative write sequence including a plurality of pulses applied by a subset including a second number of members in the set of write drivers selected according to the data pattern;
 assigning permissible numbers for pulse iterations in the write sequence, in which the permissible number assigned to at least one iteration is different than the permissible number assigned to another iteration in the write sequence, and is less than said number N of said members; and
 for said least one iteration in the plurality of iterations, enabling less than said number N of said members for pulses in the write sequence when the second number of members in the subset exceeds the assigned permissible number of write drivers.

8. The method of claim 7, wherein said storing a data pattern includes flagging the subset of the set of N bit lines to receive pulses in parallel, the second number of members of the subset being greater than the assigned permissible number, enabling a first group of write drivers in the set of write drivers to apply pulses in parallel while disabling other write drivers in the set of write drivers, and then enabling a second group of write drivers in the set of write drivers to apply pulses in parallel while disabling other write drivers in the set of write drivers, where the first and second groups have respective numbers of members equal to or less than the assigned permissible number.

9. The method of claim 7, including:
using pulses in one iteration having pulse magnitudes different than other iterations in the write sequence.

10. The method of claim 7,
wherein the write sequence includes a pre-verify step to set flags for the write drivers in the set of write drivers connected to bit lines for memory cells that fail the pre-verify step to identify members of a subset; and including
counting set flags after the pre-verify step.

11. The method of claim 7, wherein the write sequence includes setting flags in the iterations for write drivers connected to bit lines of memory cells that fail verify.

12. A method for operating a memory, comprising:
applying a write sequence to write a data pattern in a set of memory cells, the write sequence including a plurality of pulse and verify iterations, in which pulses applied to memory cells in at least one of the iterations have a pulse magnitude different than pulses in other iterations in the plurality of iterations;
assigning a permissible number of memory cells for each iteration in the plurality of iterations, in which the permissible number assigned to at least one iteration is different than the permissible number assigned to another iteration in the plurality of iterations;
determining a subset of the set of memory cells to which the pulse is to be applied for each iteration; and
for an iteration in the plurality of iterations in which the subset has a second number of members larger than the assigned permissible number, applying pulses in parallel to memory cells in a first group of memory cells in the set of memory cells, and then applying pulses in parallel to memory cells in a second group of memory cells in the set of memory cells, where the first and second groups have respective numbers of members equal to or less than the assigned permissible number.

13. The method of claim 12, including using charge pump circuitry to provide current for the pulses.

14. The method of claim 12, wherein the write sequence includes a pre-verify step, including setting flags for the memory cells that fail the pre-verify step to identify members of the subset of the set of memory cells to which the pulse is to be applied in a first pulse and verify iteration of the plurality of iterations, and including counting the number of memory cells having set flags in the subset after the pre-verify step.

15. The method of claim 14, wherein for each iteration in the plurality of iterations, resetting the flag if the corresponding memory cell passes verify in the iteration.

* * * * *